United States Patent [19]

Hamatake

[11] Patent Number: 5,270,233
[45] Date of Patent: Dec. 14, 1993

[54] METHOD FOR MANUFACTURING FIELD EFFECT TRANSISTOR HAVING LDD STRUCTURE

[75] Inventor: Nobuhisa Hamatake, Tokyo, Japan
[73] Assignee: NEC Corporation, Tokyo, Japan
[21] Appl. No.: 903,279
[22] Filed: Jun. 24, 1992

[30] Foreign Application Priority Data

Jun. 25, 1991 [JP] Japan ................ 3-153032

[51] Int. Cl.⁵ ............................... H01L 21/336
[52] U.S. Cl. ........................ 437/44; 437/57; 437/238
[58] Field of Search ............ 437/34, 41, 44, 57, 437/238; 257/336, 344, 369, 371, 408

[56] References Cited

U.S. PATENT DOCUMENTS

| | | | |
|---|---|---|---|
| 4,722,909 | 2/1988 | Parrillo et al. | 437/44 |
| 4,745,086 | 5/1988 | Parrillo et al. | 437/44 |
| 4,753,898 | 6/1988 | Parrillo et al. | 437/57 |
| 4,760,033 | 7/1988 | Mueller | 437/57 |
| 4,764,477 | 8/1988 | Chang et al. | 437/44 |
| 4,908,327 | 3/1990 | Chapman | 437/57 |
| 5,021,354 | 6/1991 | Pfiester | 437/57 |
| 5,087,582 | 2/1992 | Campbell et al. | 437/44 |

FOREIGN PATENT DOCUMENTS 64-25986 1/1989 Japan .

*Primary Examiner*—Mary Wilczewski
*Attorney, Agent, or Firm*—Burns, Doane, Swecker & Mathis

[57] ABSTRACT

In a method for manufacturing a MOS transistor having the LDD structure, an N-channel MOS transistor of the LDD structure is obtained by forming a first silicon dioxide film on the side walls of a first gate electrode by utilizing a first photoresist film and a selective growth of a first LPD silicon dioxide film by liquid phase deposition, in order to reduce the number of photolithography processes. Similarly, a P-channel MOS transistor of the LDD structure is obtained by forming a second silicon dioxide film for spacer on the side walls of a second gate electrode by utilizing a second photoresist film and a selective growth of a second LDD silicon dioxide film by liquid phase deposition.

4 Claims, 4 Drawing Sheets

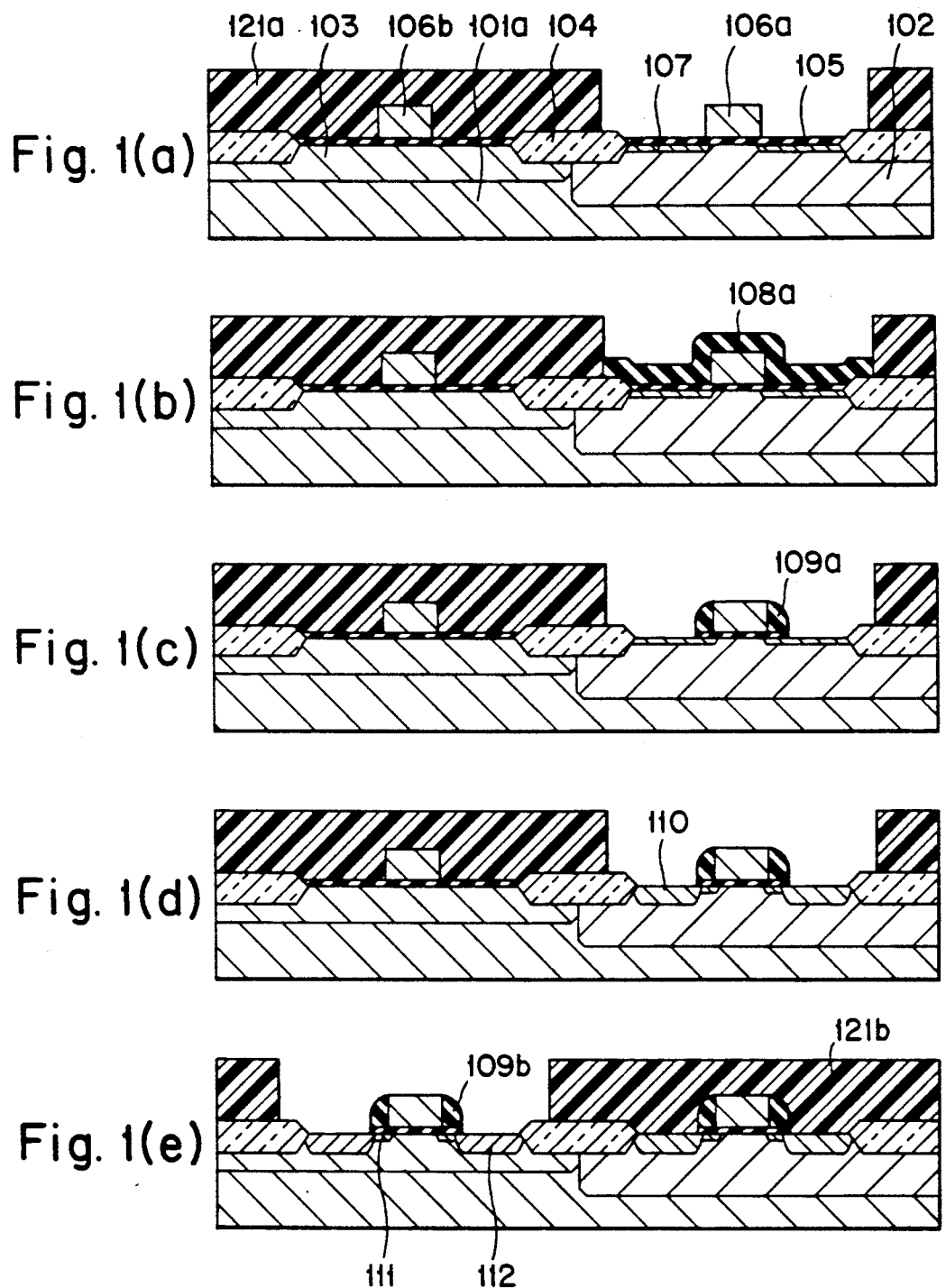

METHOD FOR MANUFACTURING FIELD EFFECT TRANSISTOR HAVING LDD STRUCTURE

BACKGROUND OF THE INVENTION

1. Field of the Invention

The present invention relates to a method for manufacturing a semiconductor device, and more particularly, to a method for manufacturing a field effect transistor having the LDD structure.

2. Description of the Prior Art

In the recent MOS transistors the lightly doped drain structure (referred to as the LDD structure hereinafter) is being adopted in order to enhance the resistance to the hot carriers by reducing the intensity of the electric field in the vicinity of the drain.

Referring to FIG. 3, a method for manufacturing a CMOS transistor having MOS transistors of the conventional LDD structure.

Following the formation of a P well 202 and an N well 203 in an N-type silicon substrate 201, an oxide film 204 for device isolation with large thickness is formed on the surface of the silicon substrate 201 by a selective oxidation, and a gate insulating film 205 consisting of a silicon dioxide film by, for example, thermal oxidation is formed on the surface of the P well 202 and the N well 203. A first gate electrode 206a and a second gate electrode 206b are formed on the P well 202 and the N well 203, respectively, using, for example, an N+-type polycrystalline silicon film. A photoresist film 221a having an opening that includes at least the gate insulating film 205 is formed on the surface of the P well 202, and an N−-type diffused layer 207 is formed by ion implantation which uses the photoresist film 221a, the gate electrode 206a, and the device isolating oxide film 204 as the mask [FIG. 3(a)].

After removing the photoresist film 221a, a photoresist film 221b having an opening at least in the gate insulating film 205 on the surface of the N well 203 is formed, and a P−-type diffused layer 211 is formed by ion implantation using the photoresist film 221b, the gate electrode 206b, and the device isolating oxide film 204 as the mask FIG. 3(b) .

After removing the photoresist film 221b, a vapor phase deposited silicon dioxide film 208 with thickness of 200 to 300 nm or so is deposited all over the surface [FIG. 3(c)].

Silicon dioxide films 209a and 209b for spacer are formed on the side walls of the gate electrodes 206a and 206b by applying reactive ion etching to the vapor phase deposited silicon dioxide film 208. The thickness of the silicon dioxide films 209a and 209b for spacer are equal [FIG. 3(d)]. It is to be noted in this specification that a side wall silicon dioxide film formed on the side faces of the gate electrode of the MOS transistor is called a silicon dioxide film for spacer.

A photoresist film 222a having an opening including at least the gate insulating film 205 on the surface of the P well 202 is formed, and an N+-type diffused layer 210 by ion implantation using the photoresist film 222a, the gate electrode 206a, and the silicon dioxide film 209a for spacer as the mask FIG. 3(e) .

After removing the photoresist film 222a, a photoresist film 222b having an opening including at least the gate insulating film 205 on the surface of the N well 203 is formed, and a P+-type diffused layer 212 is formed by ion implantation using the photoresist film 222b, the gate electrode 206b, the silicon dioxide film for spacer 209b, and the element isolating oxide film 204 as the mask [FIG. 3(f)].

By the above procedure, a CMOS transistor including MOS transistors with the LDD structure having a low concentration impurity diffused layer for reducing the electric field intensity in the vicinity of the drain is formed.

However, the method for manufacturing a CMOS transistor having MOS transistors of the conventional LDD structure requires four photolithography processes for the formation of the LDD type diffused layer. This means that two additional photolithography processes are needed compared with the case of forming a CMOS transistor having MOS transistors of non-LDD structure, leading to prolongation of the manufacturing process and generating problems of low yield and high cost of the product.

Furthermore, in the method for manufacturing a CMOS transistor having MOS transistors of the conventional LDD structure the insulating films for spacer formed on the side walls of the gate electrodes of the P-channel and the N-channel MOS transistors are formed in the same process. Therefore, the thicknesses of the insulating films for spacer formed on the side walls of the gate electrodes of both channels are equal, and there is a problem that it is not possible to form insulating films for spacer that have thicknesses optimum to the respective channels.

BRIEF SUMMARY OF THE INVENTION

It is therefore an object of this invention to provide a method for manufacturing a semiconductor device which is capable of manufacturing a field effect transistor having the LDD structure with smaller number of photolithography processes.

Moreover, it is another object of the invention to provide a method for manufacturing a semiconductor device which is capable of manufacturing insulating films for spacer formed on the side walls of the gate electrodes with thickness optimum for the respective channels.

The method for manufacturing a semiconductor device according to this invention is characterized in that it includes a process of providing a device isolating oxide film at predetermined regions on the surface of a semiconductor substrate that has a region of one conductivity type and a region of the opposite conductivity type, and forming a gate insulating film on the surface of the region of the one conductivity type and on the surface of the region of the opposite conductivity type, a process of providing a first gate electrode on the region of the one conductivity type via the gate insulating film and providing a second gate electrode on the region of the opposite conductivity type via the gate insulating film, a process of forming a first photoresist film which covers the region of the opposite conductivity type and having a first opening at least in the region of the one conductivity type, a process of forming a low concentration diffused region of the opposite conductivity type in the region of the one conductivity type by ion implantation that uses the first gate electrode and the first photoresist film as the mask, a process of selectively growing a first liquid phase deposited silicon dioxide film in the first opening by a liquid phase deposition method that uses the first photoresist film as the mask, a process of forming a first silicon dioxide film for spacer on the side walls of the first gate electrode by subjecting the first liquid phase deposited silicon dioxide film to a reactive ion etching, a process of forming a high concentration diffused layer of the opposite conductivity type in the region of the one conductivity type by ion implantation that uses the first gate electrode and the first silicon dioxide film for spacer and the first photoresist as the mask, and a process of forming, after the removal of the first photoresist film, then the formation of a second photoresist film which covers the region of the first conductivity type and has a second opening at least in the region of the opposite conductivity type, a low concentration diffused region of the one conductivity type in the region of the opposite conductivity type, selectively forming a second liquid phase deposited silicon dioxide film in the second opening, forming a second silicon dioxide film for spacer on the side walls of the second gate electrode, and forming a high concentration diffused region of the one conductivity type in the region of the opposite conductivity type, by similar processes.

According to the method for manufacturing a semiconductor device, the first photoresist film acts as the mask in the formation of the low concentration diffused layer of the opposite conductivity type in the region of the one conductivity type, as the mask in the selective growth of the first liquid phase deposited silicon dioxide film on the region of the one conductivity type, as the mask in the formation of the first silicon dioxide film for spacer on the side walls of the first gate electrode by etching the first liquid phase deposited silicon dioxide film, and further, as the mask in the formation of the high concentration diffused layer of the opposite conductivity type in the region of the one conductivity type, so that it is possible to manufacture a field effect transistor of the LDD structure by photolithography processes fewer in number than that of the conventional method. Moreover, the silicon dioxide film for spacer on the side walls of the gate electrode is formed separately for the field effect transistors of the one conductivity type and the opposite conductivity type. Therefore, it is possible to form these field effect transistors separately so as to have structures that are respectively optimum for the resistance to the hot carriers by reducing the electric field intensity in the vicinity of the drain.

BRIEF DESCRIPTION OF THE DRAWINGS

The above-mentioned and other objects, features, and advantages of this invention will become more apparent by reference to the following detailed description of the invention taken in conjunction with the accompanying drawings, wherein:

FIG. 1 shows sectional views arranged in the order of the manufacturing processes for describing the method for manufacturing an embodiment of the semiconductor device according to the invention;

DETAILED DESCRIPTION OF THE INVENTION

Figure 2A:
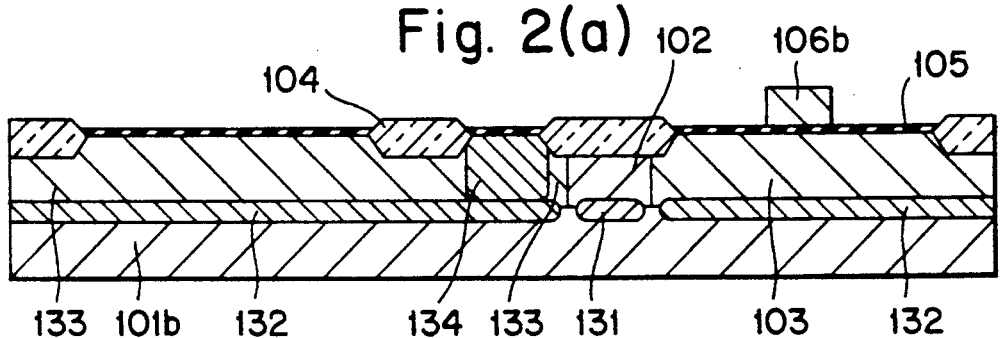
FIG. 2 shows sectional views arranged in the order of the manufacturing processes for describing the method for manufacturing another embodiment of the semiconductor device according to the invention.

Next, referring to FIG. 1, an embodiment of the invention will be described.

After forming a P well 102 and an N well 103 in an N-type silicon substrate 101a, an oxide film 104 for device isolation consisting of a silicon dioxide film with thickness of about 300 to 800 nm is formed on the surface of the N-type silicon substrate 101a by a well-known selective oxidation method. A gate insulating film 105 consisting of a silicon dioxide film with thickness of about 10 to 20 nm is formed on the surface of the P well 102 and the N well 103 by, for example, thermal oxidation. An N+-type polycrystalline silicon film with thickness of, for example, 300 to 800 nm is deposited all over the surface, and a first gate electrode 106a and a second gate electrode 106b are formed on the P well 102 and the N well 103, respectively, by patterning the polycrystalline silicon film. A 2 to 5 nm thick spontaneously oxidized film (a silicon dioxide film) is formed on the surface of the gate electrodes 106a and 106b in the cleaning process during the formation of the gate electrodes 106a and 106b. A first photoresist film 121a having an opening at least in the gate insulating film 105 on the surface of the P well 102 is formed. An $N^-$-type diffused layer 107 is formed by ion implantation of arsenic or phosphorus with dose of $1 \times 10^{12}$ to $1 \times 10^{14}$ cm$^{-2}$ that uses the photoresist film 121a, the gate electrode 106a, and the device isolating oxide film 104 as the mask [FIG. 1(a)].

By means of a selective liquid phase deposition (LPD) method, an LPD silicon dioxide film 108a with thickness of about 200 nm is formed for the opening of the photoresist film 121a [FIG. 1(b)].

The fundamental concept of the LPD method is disclosed in Japanese Patent Application Laid Open No. 64-25986. In an aqueous solution of hydrofluorosilicic acid the following chemical equilibrium as shown by Eq. (1) holds.

(1)

In addition, for boric acid (H₃BO₃) the chemical equilibrium as shown by the following Eq. (2) is valid.

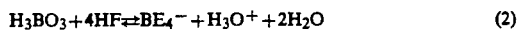

(2)

Therefore, if boric acid is added to a saturated aqueous solution of hydrofluorosilicic acid of silicon dioxide which is obtained by dissolving silicon dioxide into the solution, the chemical equilibrium in Eq. (1) proceeds in the direction to the right. This is, hydrofluoric acid (HF) is consumed and a supersaturated state of silicon dioxide is brought about so that silicon dioxide is precipitated. When a base having an organic substance such as a photoresist film as the mask is immersed in a supersaturated solution formed by the above-mentioned chemical reactions, a silicon dioxide film is formed in the regions where the mask is absent.

It is to be noted that it is preferable to use a supersaturated solution of silicon dioxide obtained by the addition of boric acid, although the precipitation of silicon dioxide can also be realized by the addition of aluminum trichloride (AlCl₃) or aluminum (Al) in place of boric acid. The reason for this is to avoid the penetration of aluminum ions into the gate insulating film and the gate electrode of the MOS transistor. Since a spontaneously oxidized film is formed on the surface of the gate electrode 106a, an LPD silicon dioxide film 108a is grown also on the surface of the gate electrode 106a. Moreover, when a metallic material such as a refractory metal film, a refractory metal silicide film, or the like is included as a component of the gate electrode, an insulating film with thickness of several to several tens of nanometers is formed in advance on the surface of the gate electrode in order to realize the deposition of an LPD silicon dioxide film also on the surface of such an electrode. Next, the silicon dioxide film is subjected to a reactive ion etching to form a silicon dioxide film 109a for spacer consisting of an LPD silicon dioxide film on the side walls of the gate electrode 106a. Since the etching rate of the LPD silicon dioxide film 108a is approximately equal to the etching rate of the gate insulating film 105 by thermal oxidation, the gate insulating film 105 on the surface of the P well 102 is also etched. The thickness of the silicon dioxide film 109a for spacer is about 200 nm [FIG. 1(c)].

Next, an N+-type diffused layer 110 is formed on the surface of the P well 102 by an ion implantation of arsenic or phosphorus with dose of $1\times10^{15}$ to $1\times10^{16}$ cm$^{-2}$ that uses the photoresist film 121a, the gate electrode 106a, the silicon dioxide film 109a for spacer, and the device isolating oxide film 104. In this way, an N-channel MOS transistor of the LDD structure is formed on the surface of the P well 102 [FIG. 1(d)].

In contrast to the two times of photolithography processes that are required in the conventional method for forming a diffused layer of the LDD structure in an N-channel MOS transistor of the LDD structure, it is possible in this embodiment to achieve the same with only one time of photolithography process.

After removal of the photoresist film 121a, a second photoresist film 121b having an opening at least in the gate insulating film 105 on the surface of the N well 103 is formed. A P−-type diffused layer 111 is formed by ion implantation of boron or boron difluoride with dose of $1\times10^{12}$ to $1\times10^{14}$ cm$^{-2}$. An LPD silicon dioxide film with thickness of about 150 nm is grown for the opening of the photoresist film 121b, and a silicon dioxide film 109b for spacer is formed on the side walls of the gate electrode 106b by etching back the LPD silicon dioxide film by reactive ion etching. The thickness of the silicon dioxide film 109b for spacer is about 150 nm. A P+-type diffused layer 112 is formed on the surface of the N well 103 by ion implantation of boron or boron difluoride with dose of $1\times10^{15}$ to $1\times10^{16}$ cm$^{-2}$. In this manner, a P-channel MOS transistor of the LDD structure is formed on the surface of the N well 103 [FIG. 1(e)].

Heretofore, two photolithography processes are required also for forming a diffused layer of the LDD structure in a P-channel MOS transistor of the LDD structure, but the same thing can be formed by this embodiment using only one photolithography process. Because of this, altogether four photolithography processes are required to formed diffused layers of the LDD structure in the method for manufacturing a conventional CMOS transistor having MOS transistors of the LDD structure. However, the same can be achieved in this embodiment by using two photolithography processes, realizing reduction of the manufacturing process, enhancing the yield, and reducing the cost.

According to the LPD method employed in this embodiment, the control of the thickness of the grown film is facilitated since the growth rate of the LPD silicon dioxide film is low at 10 to 20 nm/hr even when the width due to various conditions such as liquid temperature is taken into consideration. Moreover, since the formation of the silicon dioxide film for spacer on the side walls of the gate electrode of the N-channel MOS transistor and the formation of the silicon dioxide film for spacer on the side walls of the gate electrodes of the P-channel MOS transistor are carried out separately, the film thickness of these silicon dioxide films for spacer can be set independently with each other. Therefore, it is possible to form the insulating films for spacer having film thicknesses optimum to the respective channels.

Figure 2B:
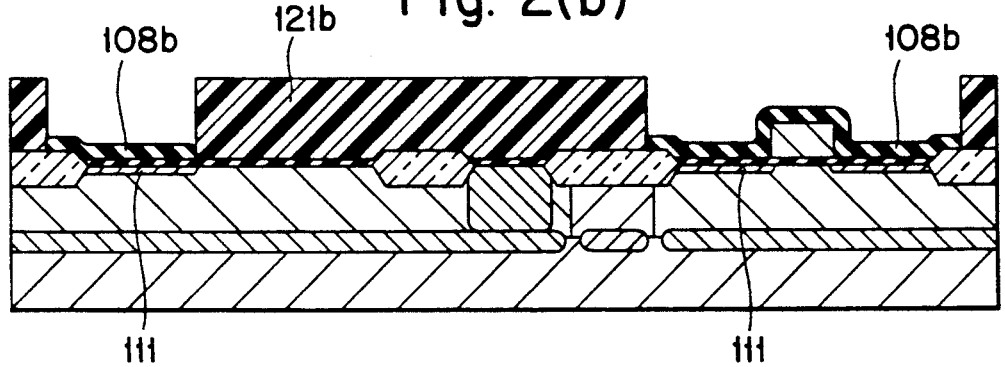
Figure 2C:
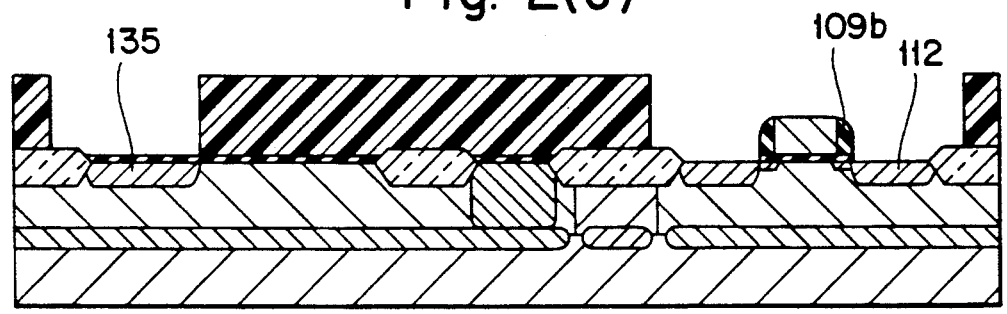
Figure 2D:
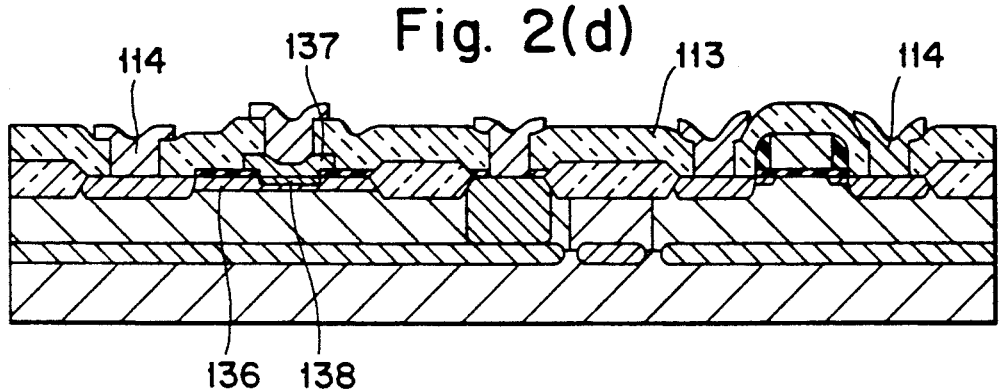
Figure 3A:
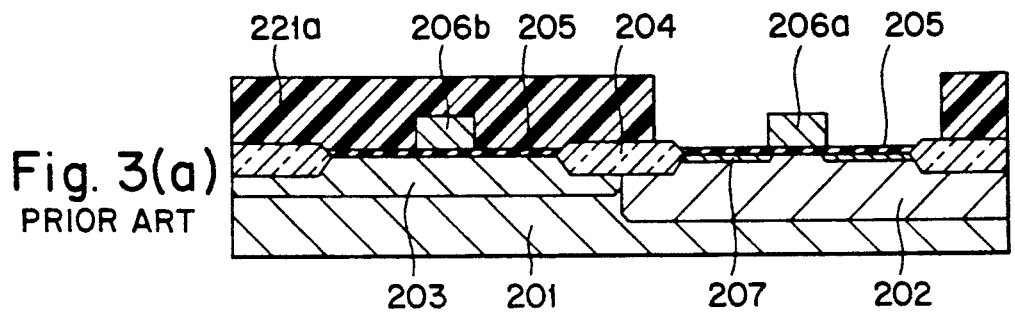
FIG. 3 shows sectional views arranged in the order of the manufacturing processes for describing the method for manufacturing the conventional semiconductor device.
Figure 3B:
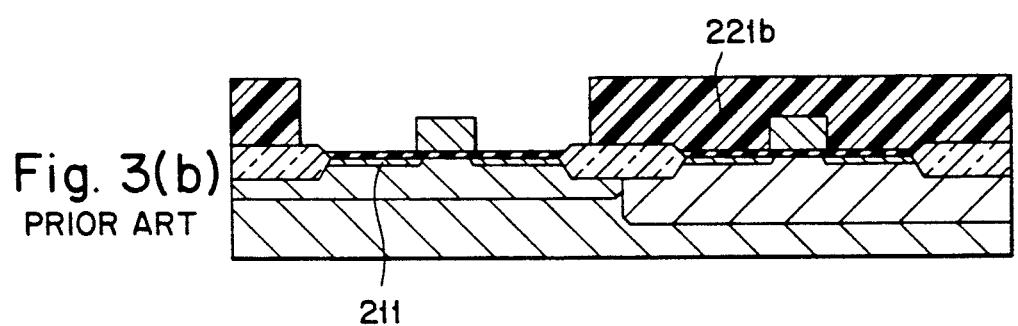
Figure 3C:
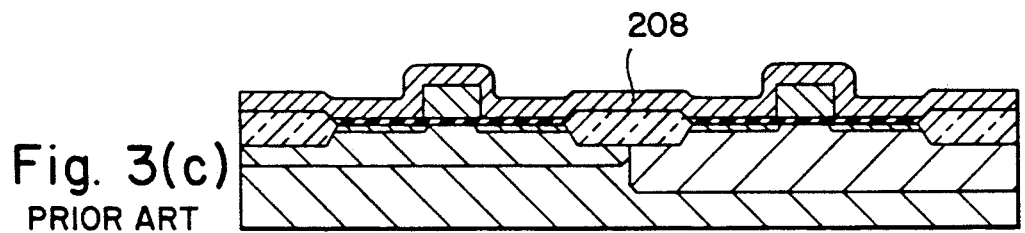
Figure 3D:
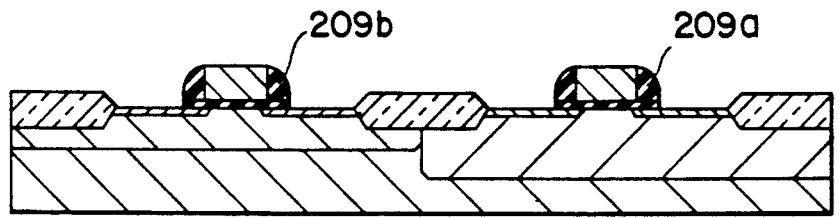
Figure 3E:
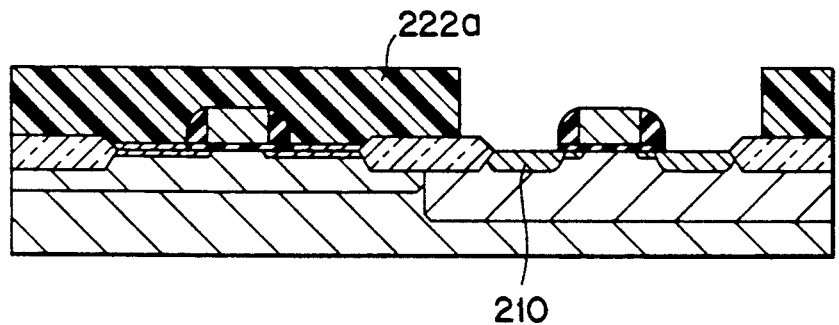
Figure 3F:
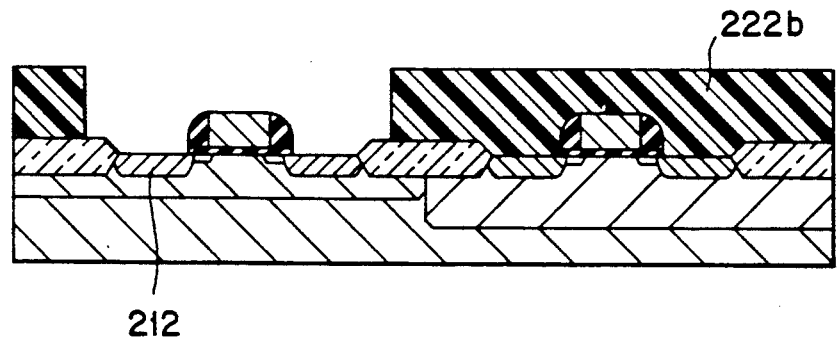

Next, referring to FIG. 2, another embodiment of the invention will be described. This embodiment represents an application of a manufacturing method fundamentally the same as the manufacturing method for the aforementioned embodiment to a Bi-CMOS transistor.

On the surface of a P-type silicon substrate 101b, a P+-type buried layer 131 and an N+-type buried layer 132 are selectively formed. The P+-type buried layer 131 is formed in the region above which an N-channel MOS transistor is scheduled to be formed and in the region above which a device isolation region for a bipolar transistor and a MOS transistor is scheduled to be formed. Similarly, the N+-type buried layer 132 is formed in the region above which a P-channel MOS transistor is scheduled to be formed and in the region above which a bipolar transistor is scheduled to be formed. An N−-type epitaxial layer 133 with thickness of about 1 μm is formed all over the surface. In the N−-type epitaxial layer 133 on the P+-type buried layer 131 there is formed a P well 102 which is connected to the P+-type buried layer 131. In the N−-type epitaxial layer 133 in the region where the P-channel MOS transistor is formed, there is formed an N well 103 which is connected to the N+-type buried layer 132. On the surface of the N−-type epitaxial layer 133, the P well 102, and the N well 103, there is selectively formed an oxide film 104 for device isolation. A gate insulating film 105 consisting of a silicon dioxide film by thermal oxidation is formed in the region on the surface of the N−-type epitaxial layer 133, the P well 102 and the N well 103 where the oxide film 104 for device isolation is absent. At about this time, an N+-type collector plug region 134 which is connected to the N+-type buried layer 132 is formed on the surface of the N−-type epitaxial layer 133 at a predetermined area in the region where the bipolar transistor is formed. A first gate electrode and a second gate electrode 106b consisting of an N+-type polycrystalline silicon film with thickness of 300 to 800 nm are formed on the P well and the N well 103. A spontaneous oxide film with thickness of 2 to 5 nm is formed on these gate electrodes [FIG. 2(a)].

After forming an N-channel MOS transistor (not shown) of the LDD structure by covering the N well 103 and the region for the formation of the bipolar transistor with a first photoresist film (the photoresist film 121a in FIGS. 1(a) to 1(c)), the first photoresist film is removed.

A photoresist film 121b which has openings in the region where a P+-type graft base region in the bipolar transistor is to be formed and at least in the gate insulating film 105 on the surface of the N well 103 is formed. A P−-type diffused layer 111 is formed by ion implantation of boron or boron difluoride with a dose in the range of $1\times10^{12}$ to $1\times10^{14}$ cm$^{-2}$. The P$^-$-type diffused layer 111 is formed also in the region where the graft base region is to be formed. Analogous to the first embodiment, an LPD silicon dioxide film 108b is formed in the openings by a selective deposition. The LPD silicon dioxide film 108b is formed also in the graft base region [FIG. 2(b)].

A silicon dioxide film 109b for spacer is formed on the side walls of the gate electrode 106b by etching back the LPC silicon dioxide film 108b by reactive ion etching. At this time, the LPD silicon dioxide film 108b in the region where the graft base region is to be formed is removed completely. The thickness of the silicon dioxide film 109b for spacer is about 150 nm. A P$^+$-type diffused layer 112 is formed on the surface of the N well 103, and a P$^+$-type graft base region 135 is formed in the region where the graft base region is to be formed by ion implantation of boron or boron difluoride with a dose in the range of $1\times10^{15}$ to $1\times10^{16}$ cm$^{-2}$. In this way, a P-channel MOS transistor is formed, and a CMOS transistor is obtained [FIG. 2(c)].

After removal of the photoresist film 121b, an N-type intrinsic base region 136 is formed by an ion implantation of boron or boron difluoride that uses a photoresist mask (not shown) as the mask. After removal of the gate insulating film 105 of a predetermined region on the surface of the intrinsic base region 136, an emitter electrode 137 consisting of an N$^+$-type polycrystalline silicon film is formed. By a heat treatment, the N-type impurity in the emitter electrode 137 is diffused and an N$^+$-type emitter region 138 is formed on the surface of the intrinsic base region 136. An interlayer insulating film 113 is deposited, and contact holes are formed through removal by etching of the interlayer insulating film 113 and the gate insulating film 105, or the interlayer insulating film 113. Metallic wirings 114 consisting of, for example, an aluminum film are formed, completing the Bi-CMOS transistor having the LDD structure according to this embodiment.

In accordance with this embodiment, the photoresist film 121b is used as the mask in the formation of the P$^-$-type diffused layer of the P-channel MOS transistor, as the mask in the selective formation of the LPD silicon dioxide film 108b, as the mask in the formation of the silicon dioxide film 109b for spacer by etching of the silicon dioxide film 108b, and further, as the mask in the formation of the P$^+$-type diffused layer 112 of the P-channel MOS transistor. Therefore, it is possible to form a MOS transistor having the LDD structure by reducing the number of photolithography processes. Moreover, in the process of formation of the CMOS transistor according to this embodiment, the surface of the region where the intrinsic base region 136 is to be formed is covered with the first photoresist film or the photoresist film 121b, so that the surface is protected from being exposed to the reactive ion etching. Therefore, the intrinsic base region 136 will not be damaged, and the deterioration of the properties of the bipolar transistor can be prevented.

Although the invention has been described with reference to specific embodiments, this description is not meant to be construed in a limiting sense. Various modifications of the disclosed embodiment, as well as other embodiments of the invention, will become apparent to persons skilled in the art upon reference to description of the invention. It is therefore contemplated that the appended claims will cover any modifications or embodiments as fall within the scope of the invention.

What is claimed is:

1. A method for manufacturing a CMOS transistor, comprising:

a process of providing an oxide film for device isolation in predetermined regions on the surface of a semiconductor substrate having a region of one conductivity type and a region of the opposite conductivity type and forming a gate insulating film on the surface of said region of the one conductivity type and on the surface of said region of the opposite conductivity type;

a process of providing a first gate electrode on said region of the one conductivity type via said gate insulating film and providing a second gate electrode on said region of the opposite conductivity type via said gate insulating film;

a process of forming a first photoresist film which covers said region of the opposite conductivity type and has a first opening at least exposing said gate insulating film on the surface of said region of the one conductivity type;

a process of forming a low concentration diffused layer of the opposite conductivity type in said region of the one conductivity type by an ion implantation which uses said first gate electrode and said first photoresist film as a mask;

a process of selectively growing a first liquid phase deposited silicon dioxide film in said first opening by a liquid phase deposition method which uses said first photoresist film as a mask;

a process of forming a first silicon dioxide film for spacer on the side walls of said first gate electrode by applying a reactive ion etching to said first liquid phase deposited silicon dioxide film;

a process of forming a high concentration diffused layer of the opposite conductivity type in said region of the one conductivity type by an ion implantation which uses said first gate electrode and said first silicon dioxide film for spacer and said first photoresist film as a mask;

a process of forming, after removing said first photoresist film, a second photoresist film which covers said region of one conductivity type and has a second opening at least exposing said gate insulating film on the surface of said region of the opposite conductivity type;

a process of forming a low concentration diffused layer of the one conductivity type in said region of the opposite conductivity type by an ion implantation which uses said second gate electrode and said second photoresist film as a mask;

a process of selectively growing a second liquid phase deposited silicon dioxide film in said second opening by a liquid phase deposition method which uses said second photoresist film as a mask;

a process of forming a second silicon dioxide film for spacer on the side walls of said second gate electrode by applying a reactive ion etching to said second liquid phase deposited silicon dioxide film; and a process of forming a high concentration diffused layer of the one conductivity type in said region of the opposite conductivity type by an ion implantation which uses said second gate electrode and said second silicon dioxide film for spacer and said second photoresist film as a mask.

2. A method for manufacturing a CMOS transistor as claimed in claim 1, which is characterized in that said first and said second liquid phase deposited silicon dioxide films are formed by a liquid phase deposition method by immersing the substrate in an aqueous solution of hydrofluorosilicic acid supersaturated with silicon dioxide formed by adding boric acid to an aqueous solution of hydrofluorosilicic acid in which silicon dioxide is dissolved in a saturated state.

3. A method for manufacturing a CMOS transistor as claimed in claim 1, wherein the thickness of said first silicon dioxide film for spacer is different from the thickness of said second silicon dioxide film for spacer.

4. A method for manufacturing a CMOS transistor as claimed in claim 1, further comprising a process of forming an insulating film on the surface of said first and said second gate electrodes after forming said first gate electrode and said second gate electrode.

* * * * *